(12) United States Patent
Logue

(10) Patent No.: US 6,271,664 B1
(45) Date of Patent: Aug. 7, 2001

(54) POLAR COORDINATES SENSOR UTILIZING AN INTEGRATED DRIVER-RESONATOR FOR INCREASING OSCILLATORY SIGNAL BUILD-UP

(75) Inventor: Delmar Leon Logue, Herrick, IL (US)

(73) Assignee: Logue Sensor Co., Herrick, IL (US)

( * ) Notice: Subject to any disclaimer, the term of this patent is extended or adjusted under 35 U.S.C. 154(b) by 0 days.

(21) Appl. No.: 09/419,140

(22) Filed: Oct. 15, 1999

Related U.S. Application Data

(63) Continuation-in-part of application No. 09/138,750, filed on Aug. 24, 1998, which is a continuation-in-part of application No. 09/023,516, filed on Feb. 13, 1998, now Pat. No. 5,939,880, and a continuation-in-part of application No. 08/832,100, filed on Apr. 3, 1997, now Pat. No. 5,909,118.

(51) Int. Cl.[7] ............................. G01N 27/72; G01R 33/12

(52) U.S. Cl. ........................ 324/240; 324/232; 324/242

(58) Field of Search .................................. 324/240, 242, 324/207.17, 207.18, 207.19, 228, 232, 233, 238, 239, 241, 243

(56) References Cited

U.S. PATENT DOCUMENTS 4,270,088 * 5/1981 Weischedel ........................ 324/241

* cited by examiner

Primary Examiner—Walter E. Snow

(57) ABSTRACT

Oscillatory signal build-up is increased in the polar coordinates sensor by integrating the rotating driving flux with the resonating flux resulting from the series resonant pick-up coil current. The imbalance flux linking the pick-up coil is more dependent on radii proximate the z-axis and is more suitable for detection of cracks radial to an aircraft rivet.

3 Claims, 4 Drawing Sheets

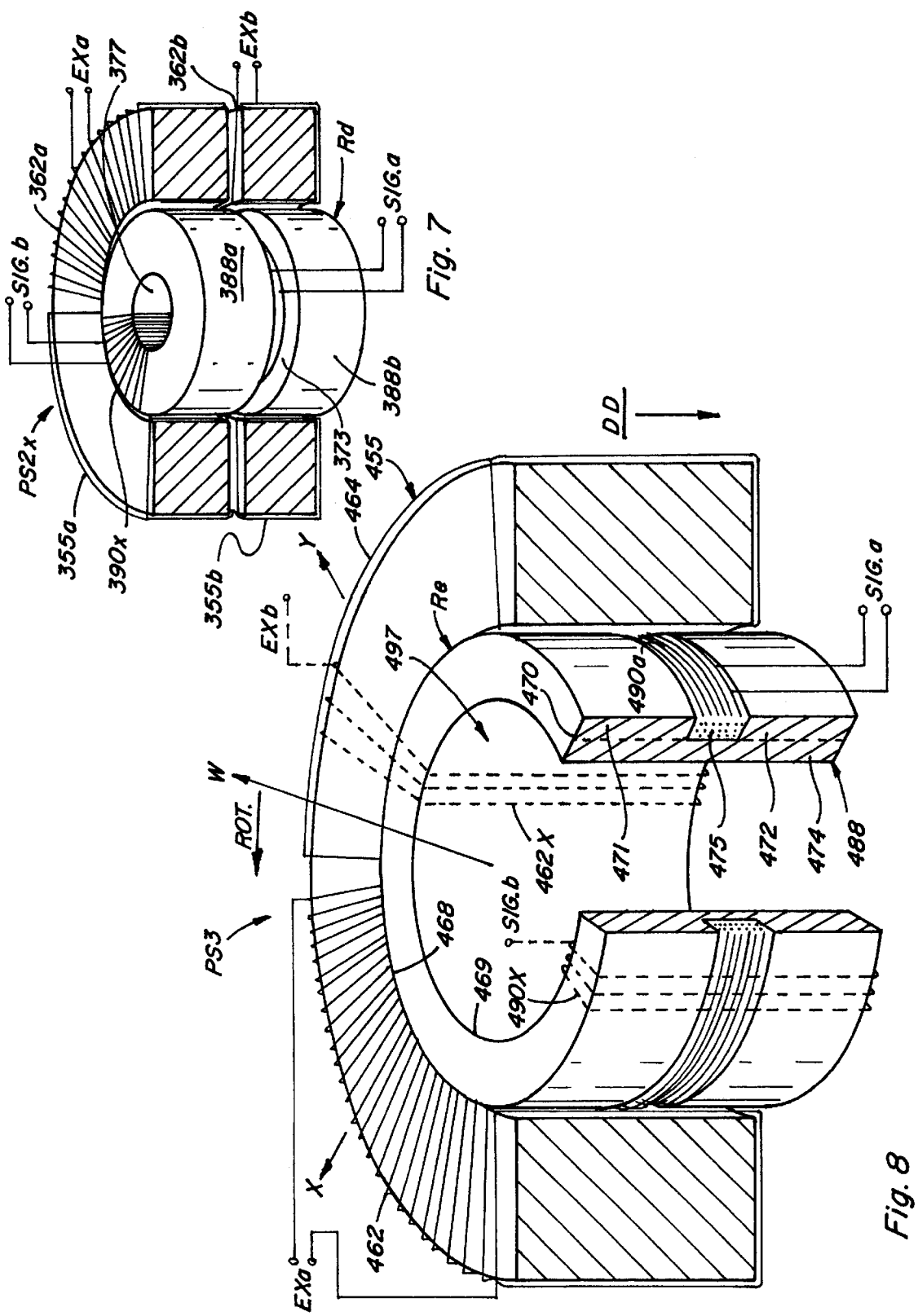

US 6,271,664 B1

POLAR COORDINATES SENSOR UTILIZING AN INTEGRATED DRIVER-RESONATOR FOR INCREASING OSCILLATORY SIGNAL BUILD-UP

CROSS-REFERENCE TO RELATED APPLICATIONS

This Patent Application is a continuation-in-part of patent application Ser. No. 09/138,750 filed Aug. 24, 1998, which is a continuation-in-part of patent application Ser. No. 09/023,516 filed Feb. 13, 1998, now U.S. Pat. No. 5,939,880 and a continuation-in-part of patent application Ser. No. 08/832,100 filed Apr. 3, 1997, now U.S. Pat. No. 5,909,118.

Some of the novel concepts are contained in the Disclosure Document Program as Disclosure Document No. 459457 filed Jul. 19, 1999.

BACKGROUND ART

Magnetically balanced devices, known as intercepter transformers e.g. Wiegand patent U.S. Pat. No. 2,479,656 control the magnitude of a secondary current according to a lesser level of current in a control winding. The underlying principle being orthogonal driving resonance, also known as parametric coupling/power transfer.

An intercepter transformer disclosed in Wiegand patent U.S. Pat. No. 2,740,096 performed the work of a saw-tooth-wave generator (poly-frequency capability). Even further, Wiegand patent U.S. Pat. No. 2,910,654 provided wide-band frequency conversion by means of passive elements. The Paraformer (Wanlass) transformer utilizes a parametric coupling wherein the flux paths of primary-secondary have independent existences and is more closely related to an oscillator. Power transfer is by means of the primary current modulating the secondary inductance. Energy is built up in a series resonant LC "tank" circuit. Frequency modulation of the polar coordinate sensor poly-phase excitation has been shown to have a similar building action i.e. a flaw imbalance triggering an LC resonant circuit into sub-harmonic signal build-up drawing enegry from the orthogonal driving field.

Fundamentals of Polar Coordinates Sensors

The sensing devices contained in the ascending Logue Patents combine (1) orthogonal driving (also known as parametric coupling), (2) a series resonant pick-up coil and capacitor, (3) an annular air gap between pick-up core and driving core, (4) a secondary annular air gap in the pick-up core magnetic circuit, (5) a ramping sine-cosine excitation frequency. These fundamental principles were set forth in Logue U.S. Pat. No. 5,909,118. In FIG. 1, driving toroid 55 is single wound with layer sine-cosine distributions (only one excitation winding 62 and leads Le are shown) for generating a hemispherical shaped effective field. Polyphase excitation causes angluar motion FR of driving dipole S-N. This driving also couples to pick-up core 88 (a pot core half), and in turn couples the workpiece (not shown). Thus at least two radii of effective flux couples the workpiece, a major hemisphere 71H and a minor hemisphere 71h in FIG. 2. Also complementary hemisphere 71Hc fringes from the opposite side of driving plane S-N.

Principle (1): A plane intersecting a hemisphere at various degrees of latitude reflects a constant axisymmetry to a point on the axis of revolution. This means, "lift-off" and layer spacing variations do not change the flaw waveform signature, only the signal amplitude. Pick-up core 88 may be a conventional pot core half comprising an outer cylindrical pole 86 and a tubular central pole 84 joined by an annular base portion 85. Pick-up coil 90 is wound coaxially in the annular space 79 connected by leads Ls. There is a central bore 93 extending axially the length of core 88. FIG. 2 is a cross-section view of pick-up core 88 illustrating mentioned resonant flux path 71R fringing across air gap 79. An imbalance (asymmetry) in minor driving arc 71h initates the resonant flux path 71R. The indicated "tank" capacitor is not shown in the present drawings for briefness, but the action assumed.

The preferred embodiments of the invention include:

(1) Resonant oscillatory initation is made more dependent on specimen flaw by routing an increased portion of the driving flux through the resonator. A minor driving dipole is induced diameter-wise across the annular sensing face of the pick-up core (now called a resonator).

(2) Disposing the resonator annular air gap to a location longitudinally within the driving toroid winding window so that the resonant flux path is integrated into a portion of the driving toroid 455 (FIG. 9), integrated linkage to the pick-up coil is increased, drawing oscillatory energy from the orthogonal driving field of the window location.

THE INVENTION

FIG. 7, is a combination of the polar sensor illustrated in FIG. 5 and toroidal driving core stacking as disclosed in copending patent application Ser. No. 09/138,750.

FIG. 8, is a section/perspective view of a polar coordinates sensor utilizing an integrated driver-resonator.

KEY DEFINATIONS

Polar Sensor: In this disclosure due emphasis is placed on the hemispherical shape of the sensing pattern as in global degrees of latitude. The formly stated hemispherical effective penetrating flux being the means for "lift-off" and layer spacing variation errorless signal generation.

Parametric Coupling: In the polar sensor the portion of the driving field (window of the driving toroid) orthogonal to the pick-up core axis, thus coplanar to the pick-up coil turns.

Resonator: A high permeability pick-up core/s having a cylindrical central pole (may include a central bore) with a pair of integral toroidial core collars. The asymmetric portion of driving flux through the central pole has an oscillatory build-up fringing between a pair of sub-toroids, integrated within the driving toroid window of a driving toroid. A pick-up coil of many turns is wound between the collars. The pick-up coil is shunted by a variable tank capacitor.

THE FIRST EMBODIMENT

Figure 3:
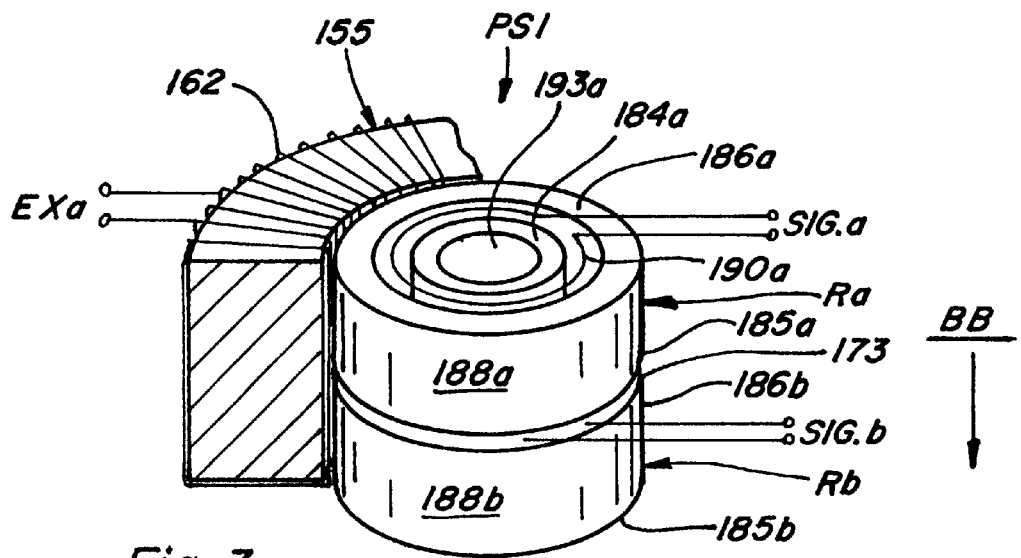
FIG. 3, is a fragmentary-sectional-perspective view of a polar sensor utilizing axially stacked pot core halves for generating at least two signals.

FIG. 3 is a perspective/fragmentary view of polar coordinates PS1 utilizing parametric coupling between the drving toroid 155 and resonator Ra. There are at least two conventional pot core halves 188a, 188b, stacked axially with open ends toward the sensing face (top in FIGS. 3, 4), forming resonators R1, R2. The effective parametric coupling and tank resonant flux circuits are elucidated by viewing the axial joining of pot core halves 188a, 188b, cross-sectional in FIG. 4. Tubular central pole 184b of core 188b is elongated and touches the base portion 185a of core 188a, leaving a predetermined annular air gap 173 between outer cylindrical pole 186b of Rb and the base portion 185a of Ra. A portion of the sensing pattern imbalance is routed through the first pot core half (cylindrical central pole 184a, coupling the extended length cylindrical central pole 184b of second pot core half). Respective pick-up coils 190a, 190b may be wound with differing number of turns. The driving toroid 155 is shown in partial, excitation winding 162 representing full poly-phase distributions for rotating driving field.

Resonators Ra, Rb, being concentrically encompassed by driving toroid 155 (excited by poly-phase) is triggered into oscillatory action (tank capacitors of each being connected in shunt with pick-up coils 190a, 190b). The size of annular air gap 173 affects the resonant frequency bandwidth.

Figure 4:
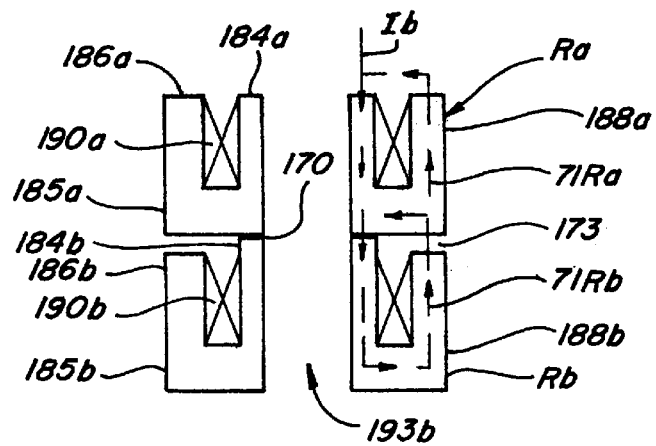
FIG. 4, is a cross-section view of the resonator in FIG. 3.

A portion of the resonant flux circuit of pot core half 188b is conducted to the base 185a of pot core 188a. Note, the differential flux action in base portion 185a (FIG. 4). Also, integral to the Returning to FIG. 4, a small sensing pattern imbalance Ib is built up by successive rotations of the excitation frequency sweep, generating the two sub-harmonic flaw signature signals SIG. a, SIG. b. These two signals may have differing phase angles for increased resolution. A simple external signal nulling element is by means of a flat copper washer eccentrically adjustable adjacent base portion 185b, driving core 155 window.

THE SECOND EMBODIMENT

Figure 5:
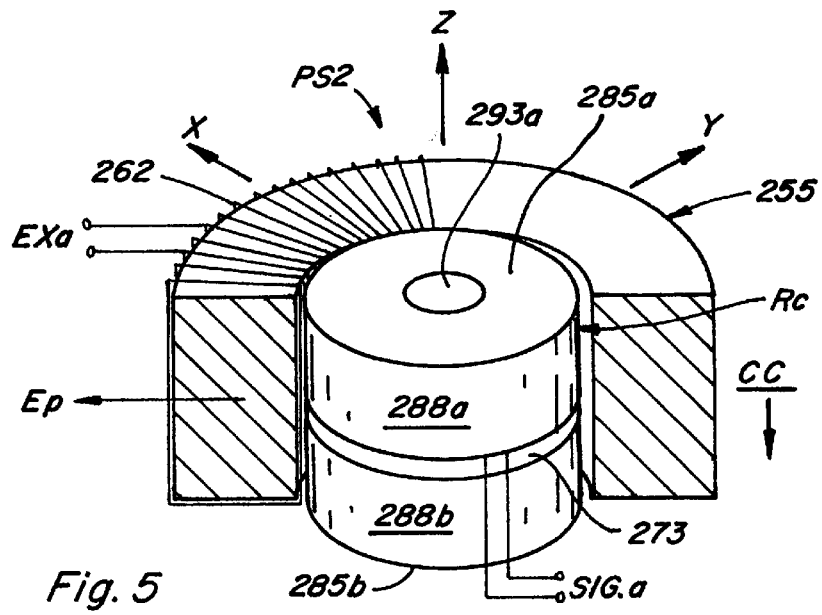
FIG. 5, is a sectional/perspective view of a polar coordinates sensor utilizing a closed face resonator.
Figure 6:
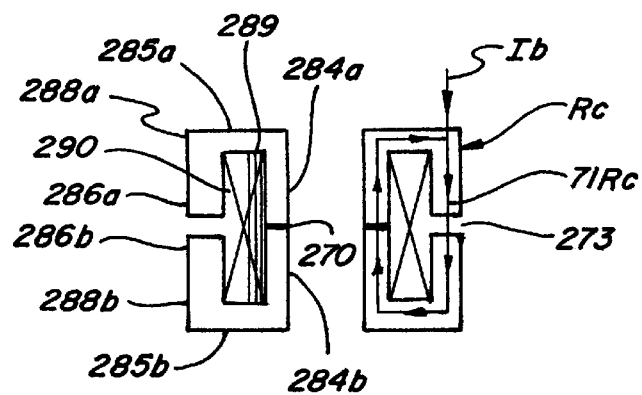
FIG. 6, is a cross-section view of the resonator shown in FIG. 5.

Polar coordinates sensor PS2, is shown isometric-sectional in FIG. 5. A high permeability (tape wound wound preferred) driving toroid 255, the poly-phase excitation winding distributions represented in partial by coil 262. A poly-phase (sweeping sine-cosine preferred) excitation generator Exa is connected to wound toroid 255 to generate a diameter-wise spinning dipole across 255. The pick-up elements are contained within resonator Rc, which comprises cup-like high permeability cores 288a, 288b, and pick-up coil 290, cross-sectional in FIG. 6. Conventional pot-core halves may be utilized for 288a, 288b, each comprising an outer cylindrical pole 286a, 286b, a central cylindrical pole 284a, 284b, and a joining base portion 285a, 285b. The outer cylindrical pole of each 286a, 286b, is machined down to form annular air gap 273, and allowing central cylindrical pole 284a, 284b, to contact at 270. Disclosure Document No. 459457, filed Jul. 19, 1999, also showed a high permeability tape wound sleeve (represented by 289) as a cylindrical coupling means around central cylindrical poles 284a, 284b and base portions 285a, 285b. FIG. 6, further illustrates an imbalance portion Ib (flaw perturbation) of the Lenz reflection initating a resonant flux circuit 71Rc, fringing across air gap 273. Resonant flux 71Rc further integrates with the driving flux generated within window 293a of driving core 255, allowing parametric power transfer and signal build-up in a LC "tank" (capacitor not shown).

Further, the symmetrical geometry of resonator Rc, with annular fringing gap 273 axially centered on equatorial plane Ep provides flux symmetry on the x-y-z axes for greater power transfer and a more perfect signal null.

FIG. 7, is a further expansion of the parametric power transfer as depicted in FIGS. 5, 6. Stacking driving toroids for generating a driving helix was taught in copending Logue patent application Ser. No. 09/138,750. As in FIG. 5, a pair of pot core halves 388a, 388b are axially coupled as taught in FIG. 6 forming resonator Rd having annular air gap 373. Resonator Rd is concentrically surrounded by at least two poly-phase wound (represented by 362a) high permeability driving toroids 355a, 355b, respective toroids being excited by poly-phase generators EXa, EXb. A first pick-up coil/s (not shown) is wound within axially joined pot core halves 388a, 388b, as taught in FIG. 6, for generating a first signal (SIG. a). To further resolve an asymmetric flux distribution in resonator Rd a toroidal wound pick-up coil/s 390x loops through aperature 377 (pot core mounting hole) and around the outside of resonator Rd generating a second signal SIG. b.

Pick-up coil/s may be single layer wound as a single solenoid or x-y coordinate pairs generating a plurality of signals.

THE THIRD EMBODIMENT

Figure 9:
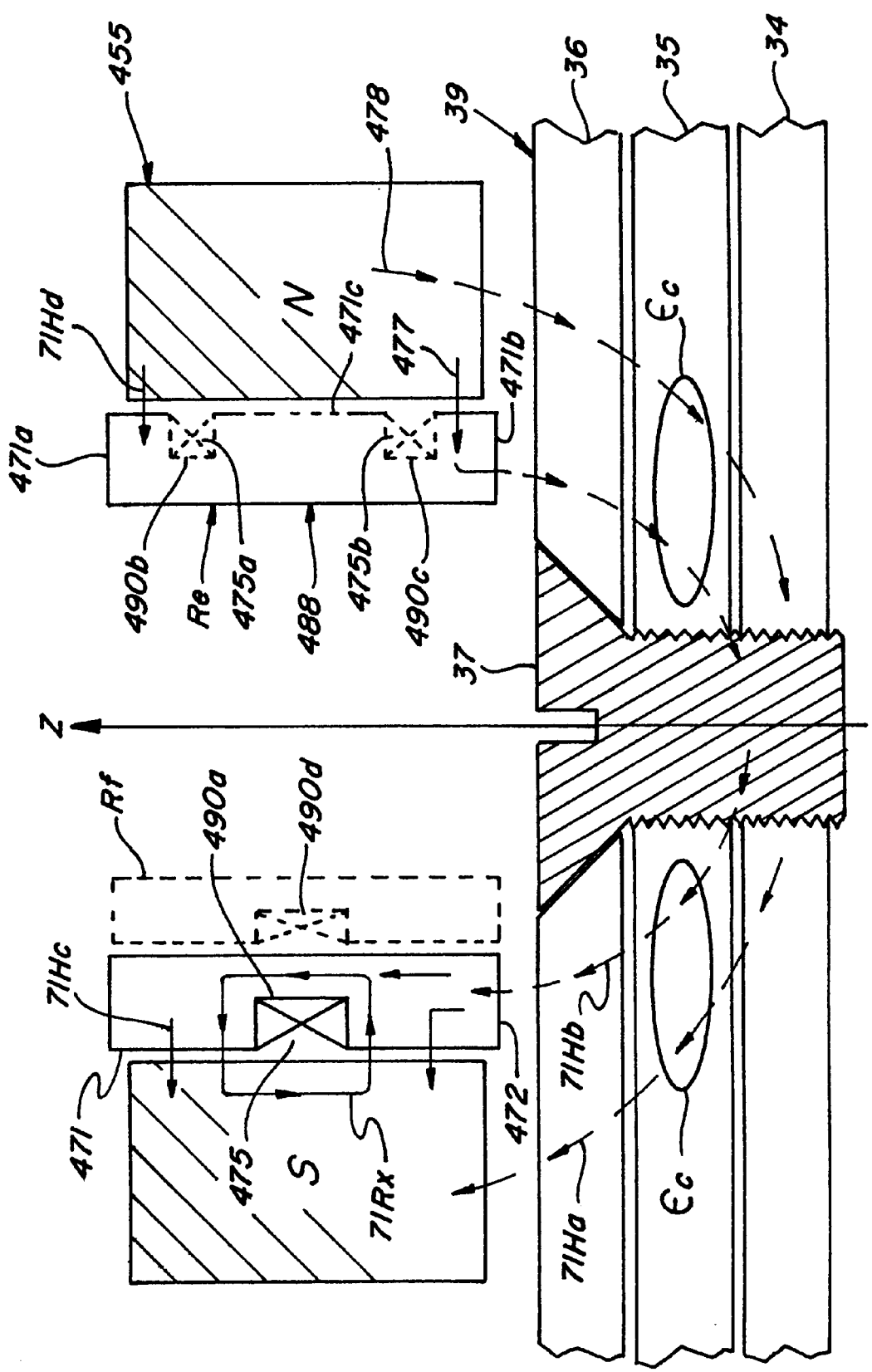
FIG. 9, is a cross-sectional view of the polar sensor depicted in FIG. 8, including the effective hemispherical driving flux penetration of a layered workpiece.

FIG. 8, is an isometric-sectional view of a polar coordinates sensor PS3, a large aperture ratio integrated driver-resonator sensor. The principle improvement being an enlarged driving/sensing diameter ratio for a more effective annulus of driving flux around an aircraft fastener (FIG. 9).

Driving toroid 455 generates a higher flux density by use of higher permeability tape wound materials in toroidal shape (cobalt tape preferred).

Driving toroid 455 has single layer wound poly-phase distributions, represented by winding 462 and connected to poly-pnase generator Exa. The resultant rotating induction vector W induces eddy currents in a conducting workpiece 39 (FIG. 9) by angular motion Rot. Resonator Re is seen as a toroid core with a circumferential groove 475 cut approximately 50 percent through the cross-section.

Alternately Re may be assembled of three sub-toroids (tape wound preferred) a pair of lesser axial length toroids 471, 472, fit concentrically and tightly around the longitudinal end portions of a third toroid 474 leaving a circumferential groove 475 for a pick-up coil 490a. The preferred method of pick-up core combination 488 is tightly winding high permeability tape stock.

There is an outside diameter 468 and an inside diameter (aperture) 469. Alternately, resonator Re may be one-piece formed of high permeability ferrite.

Wound within annular space 475 is pick-up coil 490a having many turns of small gauge magnet wire generating SIG. a.

Driving and resonant field dynamics are shown in FIG. 9, (cross-section view of both driving toroid 455, resonator Re and a layered workpiece 39). There is shown two hemi-spherical arcs of effective flux penetrating layered workpiece 39, a major hemisphere 71Ha fringing directly from the plane of driving toroid 455, and a minor hemisphere 71Hb. Effective flux hemispheres 71Ha, 71Hb, at any depth of workpiece 39 eddy current induction reflect a Lenz symmetry to the z-axes of pick-up coil 490a (conditional on probe concentricity to screw 37 and presence of a flaw). The source route of minor hemisphere 71Hb is from the plane DD of driving toroid 455 through sub-toroid 471 or 472 (depending on the obvious reversible sensing face capability). A minute imblance (flaw) of the integrated effective hemispheres 71Ha, 71Hb, routes a linkage to pick-up coil 490a. A "tank" capacitor (not shown) connected across pick-up coil 490, provides the "flywheel" action forming resonant flux circuit 71Rx. This resonant flux path shares a portion of driving toroid 455. Concentric effective hemispheres 71Ha, 71Hb, are suitable for detecting a crack radial to screw 37 located in e.g. layers 34, 35, 36. Notice, the effective concentric eddy current induction of spinning hemispheres 71Ha, 71Hb, induces a FIG. 8 circuit ec, of eddy current around screw 37.

The resultant concentric Lenz reflection is from the most likely area for crack formation. The proportion between driving flux portions 477, 478, (source of 71Ha, 71Hb) is modulated by flaw, thus changing the flux linkage to pick-up coil/s 490a, 490b, 490c. Alternately, the outer diameter 468 of resonator Re may be sub-divided providing at least two annular air gaps (grooves) e.g. 475a, 475b integrated with sub-toroids 471a, 471b, 471c, wound with respective pick-up coils 490b, 490c, for a plurality of signals from differing longitudinal locations on Re.

In an extended version: a second resonator e.g. Rf, may be concentrically disposed inside resonator Re for generating additional signal/s.

Returning back to FIG. 8, additional signal/s may be generated by troidal pick-up coil/s 490x (shown in partial distribution/s) wound around the outside of resonator Re. These additional pick-up coils may be distributed on x-y axes or a single pick-up coil 360 degrees in length. In an alternate excitation winding 462x the poly-phase distributions (symbolized by fragmentary dashed lines) encircles both the driving toroid 455 and resonator Re (poly-phase excitation generator/s EXb.)

FURTHER UTILITY

By simply enlarging the diameter (e.g. 18") of polar sensor PS3 (FIG. 8) while keeping the cross-section area to a handheld weight a buried coin/mine detector is provided (excition sweep frequency determined by application). A further extension of sub-surface conducting material detection is subsea hydrocarbon leak detection utilizing sensor PS3. Oil bubbling through sensing aperture 477 would upset the symmetry of the salt water currents induced by induction vector W, thus generating a modulated signal. Prior art inductive detection of subsea oil leaks is found in Warren et al. U.S. Pat. No. 4,282,487.

Figure 1:
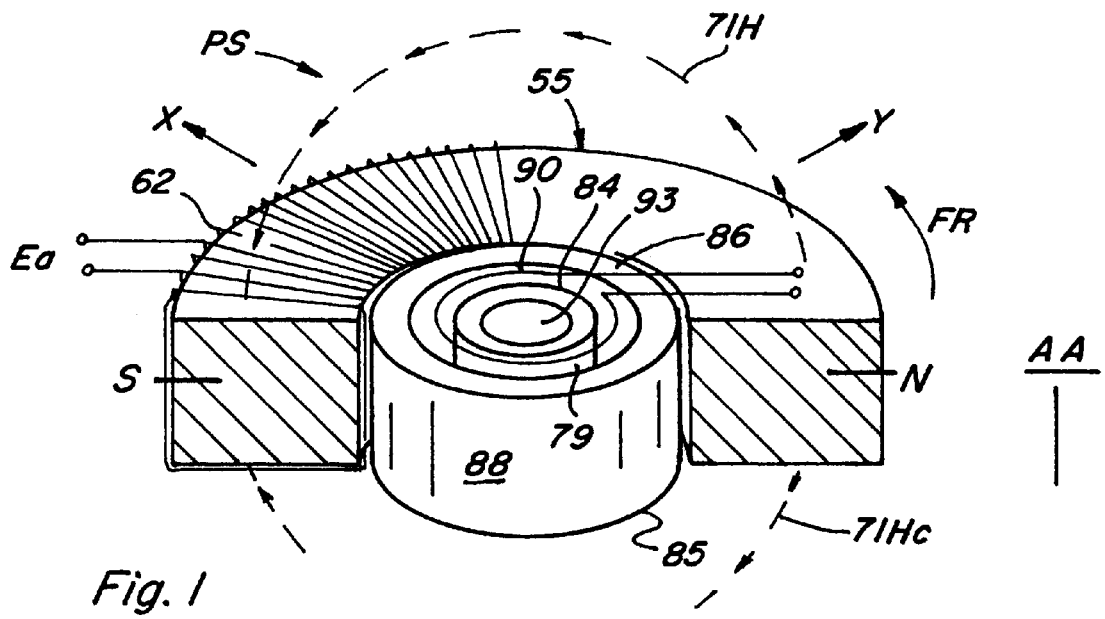
FIG. 1, is a cross-sectional/perspective view of a prior art polar coordinates sensor.
Figure 2:
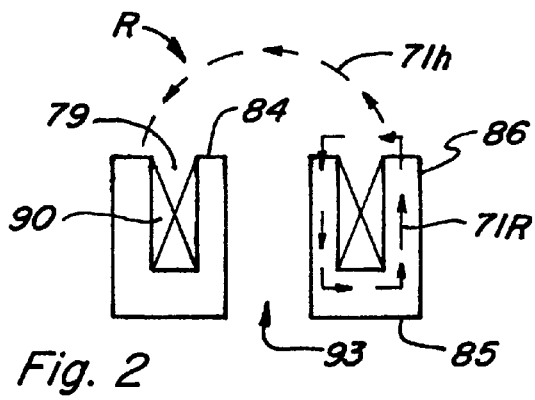
FIG. 2, is a cross-section view of the pick-up core of the sensor shown in FIG. 1.

A dual sensing face proximity sensor utilizing the mentioned complementary effective flux hemispheres 71H, 71Hc, (FIG. 1), the resultant signal phase angle of the single pick-up coil 490a version being dependent on vectorial addition of the respective targets location, material and mass. A further application of the last sentence being, comparison of metal sheets (the plane of sensor PS3 disposed between layers).

A further use of PS3, is a keyed shaft angular resolver e.g. mounted concentric around a shaft, reading angle by signal phase.

I claim:

1. A polar coordinates sensor utilizing a closed end resonator of stacked pot core halves disposed concentrically within the window of a driving toroid for generating a polar coordinates signal, said sensor comprising:

a) the said driving toroid being formed of a high permeability material, and single layer wound with poly-phase excitation windings;
  i) poly-phase excitation means connected to said excitation windings for generating a rotating induction vectot diameter-wise across the equatorial plane of the said driving toroid, said induction vector further causing complementary hemispheres of effective flux to fringe from the said equatorial plane;
 b) said resonator comprising first and second pot core halves formed of a high permeability material, and;
 c) each pot core half comprising:
  i) a tubular central pole formed around a central axis, an outer cylindrical pole concentrically disposed around the central pole, and spaced apart to provide an annular pick-up coil space, and a base portion for connecting the central and outer poles at one end, the opposite end forming an annular fringing gap, the central pole extending axially slightly beyond the outer cylindrical pole axial length, and;
  ii) a pick-up coil wound around the central pole for generating a polar coordinates signal;
  iii) a variable capacitor connected across the pick-up coil for resonant tuning;
  iv) the said pot core halves being axially stacked with annular fringing gaps facing each other with extended length central poles in contact for providing an annular fringing gap between cylindrical outer poles for integrated flux fringing within driving toroid window.

2. A polar coordinates sensor having a large aperture ratio resonator for generating at least one polar coordinates signal, said sensor comprising:

a) a driving toroid having a central window formed of a high permeability material, and;
  i) said driving toroid being single layer wound with poly-phase excitation windings, and;
  ii) poly-phase excitation means being connected to said excitation windings for generating a rotating induction vector diameter-wise originating from the equatorial plane of the driving toroid, said induction vector causing complementary hemispheres of effective flux to fringe from the said equatorial plane;
 b) said resonator comprising a first sub-toroid having a greater axial length and a lesser outside diameter and a pair of sub-toroids having a lesser axial length and a lesser inside diameter, the said pair of sub-toroids being concentrically mounted over the said first sub-toroid leaving a circumferential groove portion between said pair;
  i) a pick-up coil of many turns wound concentrically within the said groove for generating a polar coordinates signal;
  ii) the said resonator being mounted concentrically and axially centered within the said central window.

3. The polar coordinates sensor according to claim 2, further defined as a sub-surface metal detector by enlarging the respective diameters of the said driving toroid and resonator.

* * * * *